United States Patent [19]
Sato et al.

[11] Patent Number: 5,849,467
[45] Date of Patent: *Dec. 15, 1998

[54] METHOD FOR THE PRE-TREATMENT OF A PHOTORESIST LAYER ON A SUBSTRATE SURFACE

[75] Inventors: Mitsuru Sato, Yokohama; Naomi Nagatsuka, Isehara; Koichi Nagasawa, Kanagawa-ken; Hutoshi Shimai, Fujisawa; Kouji Harada, Yamato, all of Japan

[73] Assignee: Tokyo Ohka Kogyo Co., Ltd., Japan

[ * ] Notice: This patent issued on a continued prosecution application filed under 37 CFR 1.53(d), and is subject to the twenty year patent term provisions of 35 U.S.C. 154(a)(2).

[21] Appl. No.: 788,442

[22] Filed: Jan. 28, 1997

[30] Foreign Application Priority Data

Jan. 29, 1996 [JP] Japan ..................................... 8-034301
May 20, 1996 [JP] Japan ..................................... 8-124835

[51] Int. Cl.$^6$ ..................................................... G03C 5/00
[52] U.S. Cl. ........................................... 430/327; 430/331
[58] Field of Search ..................................... 430/331, 327

[56] References Cited

U.S. PATENT DOCUMENTS

| | | | |
|---|---|---|---|
| 4,592,787 | 6/1986 | Johnson | ..................................... 134/38 |
| 4,886,728 | 12/1989 | Salamy et al. | ........................... 430/331 |
| 5,334,332 | 8/1994 | Lee | ........................................... 252/548 |

FOREIGN PATENT DOCUMENTS

| | | |
|---|---|---|
| 63-34542 | 2/1988 | Japan . |
| 63-69563 | 3/1988 | Japan . |
| 63-278057 | 11/1988 | Japan . |
| 8-102434 | 4/1996 | Japan . |
| 8-97205 | 4/1996 | Japan . |

*Primary Examiner*—Janet C. Baxter
*Assistant Examiner*—Rosemary Ashton
*Attorney, Agent, or Firm*—Wenderoth, Lind & Ponack

[57] ABSTRACT

The invention proposes an improved method for the pre-treatment of a photoresist layer formed on a substrate surface prior to pattern-wise exposure of the photoresist layer to actinic rays, in which extraneous portions of the resist layer formed by overspreading of the photoresist solution as in the marginal zone of the patterning area and on the peripheral and back surfaces of the substrate, by dissolving away with a cleaning solution. In contrast to the conventional cleaning solutions consisting entirely or mainly of an organic solvent capable of dissolving the photoresist composition, the cleaning solution used in the inventive method is an aqueous alkaline solution containing a water-soluble alkaline compound dissolved in an aqueous medium consisting of water and a limited amount of a water-miscible organic solvent such as monohydric alcohols, alkyleneglycol monoalkyl ethers and aprotic solvents. The cleaning solution may optionally contain an anti-corrosion agent.

20 Claims, 1 Drawing Sheet

METHOD FOR THE PRE-TREATMENT OF A PHOTORESIST LAYER ON A SUBSTRATE SURFACE

BACKGROUND OF THE INVENTION

The present invention relates to a method for the pre-treatment of a photoresist layer on a substrate surface or, more particularly, the invention relates to a method for the conditioning pre-treatment of a photoresist layer formed on a substrate surface by coating with a photoresist solution prior to the pattern-wise exposure of the photoresist layer to actinic rays in the manufacturing process of various kinds of electronic devices such as semiconductor devices and liquid-crystal display panels by utilizing the photolithographic technology.

Needless to say, the manufacturing process of many of the electronic devices mentioned above involves a photolithographic process for patterning of a resist layer formed on the surface of a substrate, in which the surface of a substrate is first coated uniformly with a photoresist composition in the form of a solution in an organic solvent on a suitable coating machine such as spinners followed by drying to form a dried photoresist layer and the photoresist layer is exposed pattern-wise to actinic rays to form a latent image of the pattern which is developed by selectively dissolving away the resist layer with a developer solution by utilizing the difference in the solubility behavior of the resist layer between the areas exposed and unexposed to the patterning actinic rays.

In the above described photolithographic process involving coating the substrate surface with a photoresist solution, it is almost always the case that the coating layer of the photoresist solution is not limited to an exactly defined area to be subjected to the subsequent patterning work but the photoresist solution spreads beyond the defined area for patterning to form an undesired resist layer on the areas including the peripheral surfaces and sometimes the back surface of the substrate to form an extraneous resist layer with a thick-walled portions of the resist layer along the circumference of the resist layer as spread due to the surface tension of the photoresist solution. It is important accordingly that such an extraneous resist layer be removed in a pre-treatment from the substrate surface prior to the pattern-wise exposure to actinic rays since otherwise the processing procedures to follow are greatly disturbed.

The above mentioned pre-treatment of the photoresist layer on the substrate surface to remove the extraneous resist layer is conventionally undertaken by bringing the extraneous resist layer into contact with an organic solvent capable of dissolving the photoresist layer either before or after drying so as to dissolve away the resist layer. The organic solvent used as a remover agent for this purpose is selected from those, in addition to consideration of good solubility behavior for the photoresist composition as a matter of course, having a relatively high flash point from the standpoint of preventing a fire hazard and having little toxicity against human body to ensure safety of workers. It is usual that a remover solution is prepared by the admixture of such an organic solvent with several additives to improve the dissolving power to the resist layer.

Use of the above mentioned remover solution mainly consisting of an organic solvent for the photoresist composition, however, has a serious problem that the solvent sometimes causes swelling of the resist layer on the marginal zones of the area defined for photolithographic patterning adjacent to the area from which the extraneous resist layer is to be removed so that the resist layer left on the area defined for patterning has an edge surface not standing upright on the substrate surface in the cross sectional profile to decrease the quality of the resist layer after patterning. This drawback in the use of an organic solvent as a remover solution in the pre-treatment of a photoresist layer on the substrate surface can be eliminated to some extent by the use of an aqueous solution of an alkaline compound having a relatively low surface tension in view of the solubility of photoresist compositions in general in an aqueous alkaline solution, although use of an aqueous alkaline solution as a remover or stripper solution is accompanied by another disadvantage due to an increased go-around of the solution to and over the back surface of the substrate so that an adverse influence is caused on the subsequent processes.

Use of an aqueous alkaline solution is not limited to the pre-treatment of the photoresist layer prior to the pattern-wise exposure of the resist layer to actinic rays but an aqueous alkaline solution is used as a developer solution in the development treatment after pattern-wise exposure and in the whole-surface removing treatment of resist layers. The aqueous alkaline solutions used in these treatments are not quite satisfactory as such in the pre-treatment removal of the photoresist layer prior to the pattern-wise exposure because each of these solutions is formulated to be specifically suitable for the respective treatments under quite different conditions from the pre-treatment as the subject matter of the present invention in respects of the properties of the resist layer to be dissolved away and the solubility behavior of the solution to the particular resist layer. For example, the development treatment is performed by the contact of the photoresist layer after formation of a latent image with the developer solution for 30 to 90 seconds and the whole-surface removing treatment is conducted for complete removal of the resist layer over the whole substrate surface.

SUMMARY OF THE INVENTION

The present invention accordingly has an object to provide a novel and improved method for the pre-treatment of a photoresist layer on a substrate surface prior to the pattern-wise exposure of the photoresist layer to actinic rays.

Thus, the present invention provides, in a primary aspect of the invention, a method for the pre-treatment of a photoresist layer formed on the surface of a substrate from an alkali-soluble photoresist composition which comprises the step of:

bringing, prior to a pattern-wise exposure of the photoresist layer to actinic rays in an area defined for patterning, the photoresist layer on the substrate surface in areas excepting for the area defined for the pattern-wise exposure to actinic rays into contact with an aqueous cleaning solution, which consists essentially of (a) a mixture of water and a water-miscible organic solvent as an aqueous medium and (b) a water-soluble alkaline compound dissolved in the aqueous medium, to effect dissolution of the photoresist layer.

It is preferable that the aqueous cleaning solution consists of: from 0.05 to 20% by weight of the water-miscible organic solvent, from 0.05 to 20% by weight of the water-soluble alkaline compound and the balance of water.

The water-miscible organic solvent is selected preferably from the group consisting of monohydric alcohols, alkyl ethers of alkylene glycol and aprotic solvents. The water-soluble alkaline compound is selected preferably from the group consisting of sodium hydroxide, potassium hydroxide, sodium carbonate and sodium hydrogencarbonate among inorganic alkaline compounds and alkanolamine compounds, nitrogen-containing heterocyclic compounds and quaternary ammonium hydroxides among organic alkaline compounds.

Further, the invention provides, in a secondary aspect of the invention, a method for the pre-treatment of a photoresist layer formed on the surface of a substrate from an alkali-soluble photoresist composition which comprises the step of: bringing, prior to a pattern-wise exposure of the photoresist layer to actinic rays in an area defined for patterning, the photoresist layer on the substrate surface in areas excepting for the area defined for the pattern-wise exposure to actinic rays into contact with an aqueous cleaning solution, which consists essentially of (a) a mixture of water and a water-miscible organic solvent as an aqueous medium, (b) a water-soluble alkaline compound dissolved in the aqueous medium and (c) an anti-corrosion agent selected from the group consisting of aromatic hydroxyl compounds, alkynols and triazole compounds dissolved in the aqueous medium, to effect dissolution of the photoresist layer.

The amount of the anti-corrosion agent as the component (c) in the aqueous cleaning solution is preferably in the range from 0.01 to 10% by weight. The amounts of the water-miscible organic solvent and the water-soluble alkaline compound can be the same as in the aqueous cleaning solution according to the primary aspect of the invention.

DETAILED DESCRIPTION OF THE PREFERRED EMBODIMENTS

Figure 1:
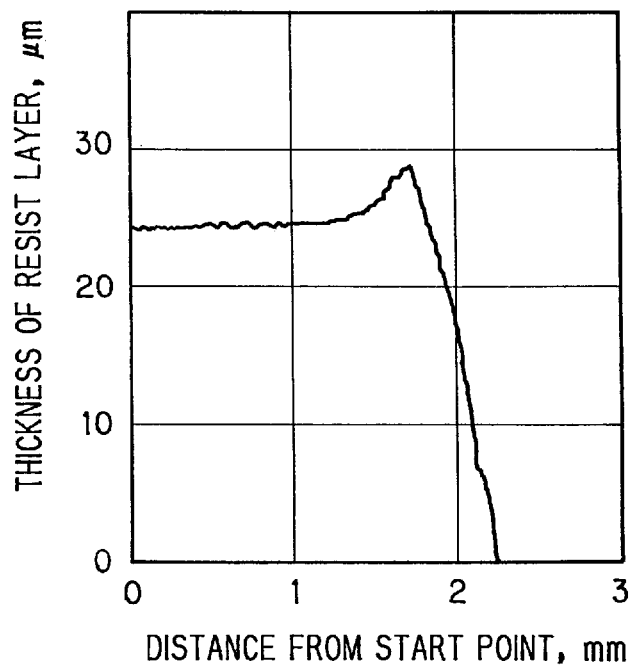
FIGS. 1 and 2 are each a graphic showing of swelling of the photoresist layer in a conventional method and in the inventive method, respectively.

As is described above, the present invention provides a method for the pre-treatment of a photoresist layer on a substrate surface prior to pattern-wise exposure to actinic rays by using a specific aqueous cleaning solution containing one or more of specified solutes in such amounts that the resultant aqueous solution may have a surface tension in the range from 35 to 70 dyne/cm at 25° C.

The photoresist layer to be subjected to the pre-treatment according to the inventive method is formed on the surface of a substrate such as a silicon wafer, glass plate and the like by using a photoresist solution containing an alkali-soluble photosensitive composition. The photoresist layer formed by coating with the photoresist solution is preferably dried before the pre-treatment according to the inventive method.

The solvent in the aqueous cleaning solution used in the inventive method is a mixture consisting of water and a water-miscible organic solvent which serves to enhance the dissolving power of the solution to the photoresist layer.

Examples of the water-miscible organic solvent forming a part of the aqueous cleaning solution include: sulfur-containing organic compounds such as dimethyl sulfoxide and sulfolane; amide compounds such as N,N-dimethyl formamide, N-methyl formamide, N,N-dimethyl acetamide, N-methyl acetamide and N,N-diethyl acetamide; imidazolidinone compounds such as 1,3-dimethyl-2-imidazolidinone, 1,3-diethyl-2-imidazolidinone and 1,3-diisopropyl-2-imidazolidinone; monohydric alcohols such as methyl alcohol, ethyl alcohol and isopropyl alcohol, mono(lower alkyl) ethers of polyhydric alcohols such as monomethyl, monoethyl, monopropyl and monobutyl ethers of ethylene glycol, propylene glycol or dipropylene glycol; lactam compounds such as 2-butyrolactam, i.e. 2-pyrrolidone; and cyclic ethers such as dioxane, of which preferred are the aprotic solvents including the above named sulfur compounds, amide compounds and imidazolidinone compounds, monohydric alcohols and monoalkyl ethers of alkylene glycols. These water-miscible organic solvents can be used either singly or as a mixture of two kinds or more according to need. The amount of the water-miscible organic solvent in the aqueous cleaning solution is in the range from 0.05 to 20% by weight or, preferably, from 0.5 to 15% by weight.

The water-soluble alkaline compound to be dissolved in the aqueous medium consisting of water and the above mentioned water-miscible organic solvent can be an inorganic or organic alkaline compound depending on the particular application.

Examples of the inorganic alkaline compound include sodium hydroxide, potassium hydroxide, sodium carbonate, sodium hydrogencarbonate, sodium silicate, sodium metasilicate and ammonia water, of which sodium hydroxide, potassium hydroxide, sodium carbonate and sodium hydrogencarbonate are preferred.

Examples of the organic alkaline compound include: aliphatic amine compounds such as ethylamine, n-propylamine, n-butylamine, sec-butylamine, amylamine, cyclohexylamine, dimethylamine, diethylamine, di-n-butylamine, triethylamine, methyldiethylamine, tributylamine, tripropylamine and the like; alkanol amine compounds such as ethanolamine, diethanolamine, triethanolamine, 2-(2-aminoethoxy)ethanol, monoisopropanolamine, diisopropanolamine, triisopropanolamine, N-ethylethanolamine, N-butylethanolamine and the like; alkylene polyamine or polyalkylene polyamine compounds such as ethylenediamine, propylenediamine, diethylenetriamine, triethylenetetramine, N,N-diethylethylenediamine, N,N'-diethylethylenediamine, 1,4-butanediamine, N-ethylethylenediamine, 1,2-propanediamine, 1,3-propanediamine, 1,6-hexanediamine and the like; nitrogen-containing heterocyclic compounds such as pyridine, (2-hydroxyethyl)pyridine, pyrazine, piperazine, N-methylpiperazine, N-(2-hydroxyethyl)piperazine, (2-hydroxyethyl)piperazine, piperidine, (2-hydroxyethyl) piperidine, N-methyl-4-piperidone, N-methyl-2-pyrrolidone, 1-(2-hydroxyethyl)-2-pyrrolidone, imidazole, 2-methylimidazole, morpholine, N-ethylmorpholine, 4-(2hydroxyethyl)morpholine and the like; quaternary ammonium hydroxides such as tetramethylammonium hydroxide, tetraethylammonium hydroxide, trimethyl(2-hydroxyethyl)ammonium hydroxide i.e. choline, and the like, of which alkanolamines and quaternary ammonium hydroxides are preferred. These organic alkaline compounds can be used either singly or as a combination of two kinds or more according to need or in combination with an inorganic alkaline compound. It is sometimes advantageous in order to improve the dissolving power of the cleaning solution to the photoresist layer that the solution contains a nitrogen-containing heterocyclic compound such as pyridine, (2-hydroxyethyl)pyridine, N-methyl-2-pyrrolidone, 1-(2-hydroxyethyl)-2-pyrrolidone, imidazole, 2-methylimidazole and the like.

Concentration of the above described water-soluble alkaline compounds in the aqueous cleaning solution is in the range from 0.05 to 20% by weight or, preferably, from 0.1 to 15% by weight. The amount of the water-soluble alkaline compound is selected within the above mentioned range of concentration according to a criterion that the resultant aqueous solution has a surface tension in the range from 35 to 70 dyne/cm or, preferably, from 40 to 70 dyne/cm at 25° C. When the surface tension of the cleaning solution is too low, an increase is caused in the troubles due to go-around and spreading of the solution over the whole back surface of the substrate resulting in a decrease in the workability in subsequent processing.

Though optional, an anti-corrosion agent can be added to the aqueous cleaning solution used in the inventive method in order to reduce corrosive attack of the solution to metallic parts of, for example, the coating machine according to need. The anti-corrosion agent suitable for the purpose is exemplified by aromatic hydroxyl compounds, alkynol compounds and triazole compounds though not particularly limitative thereto.

Examples of the above mentioned aromatic hydroxyl compound include: phenol, cresol, xylenol, pyrocatechol, resorcinol, hydroquinone, pyrogallol, 1,2,4-benzenetriol, salicyl alcohol, p-hydroxybenzyl alcohol, o-hydroxybenzyl alcohol, p-hydroxyphenethyl alcohol, p-aminophenol, m-aminophenol, diaminophenol, aminoresorcinol, p-hydroxybenzoic acid, o-hydroxybenzoic acid, 2,4-dihydroxybenzoic acid, 2,5-dihydroxybenzoic acid, 3,4-dihydroxybenzoic acid, 3,5-dihydroxybenzoic acid and the like, of which pyrocatechol is preferred.

Examples of the above mentioned alkynol compound include: 2-butyn-1,4-diol, 3,5-dimethyl-1-hexyn-3-ol, 2-methyl-3-butyn-2-ol, 3-methyl-1-pentyn-3-ol, 3,6-dimethyl-4-octyn-3,6-diol, 2,4,7,9-tetramethyl-5-decyn-4,7-diol, 2,5-dimethyl-3-hexyn-2,5-diol and the like, of which 2-butyn-1,4-diol is preferred.

Examples of the above mentioned triazole compound include: benzotriazole, o-tolyltriazole, m-tolyltriazole, p-tolyltriazole, carboxybenzotriazole, 1-hydroxybenzotriazole, nitrobenzotriazole, dihydroxypropylbenzotriazole and the like, of which benzotriazole is preferred.

These anti-corrosion agents, either singly or as a combination of two kinds or more according to need, can be contained in the aqueous cleaning solution in a concentration in the range from 0.01 to 10% by weight or, preferably, from 0.1 to 5% by weight.

In addition, it is of course optional that the aqueous cleaning solution used in the inventive method is admixed with a small amount of a surface active agent with an object to improve the wettability of the resist surface with the cleaning solution or to adjust the surface tension of the solution. The surface active agent used for this purpose is not particularly limitative including fluorocarbon-based, silicone-based, non-ionic and anionic surface active agents.

The photoresist composition, from which a resist layer is formed on the substrate surface and subjected to the pre-treatment according to the inventive method, can be of the positive-working type or negative-working type provided that it is soluble in an aqueous alkaline solution.

The positive-working photoresist composition includes those comprising an alkali-soluble novolac resin as a film-forming ingredient and an ester of naphthoquinone-1,2-diazide sulfonic acid as a photosensitive ingredient and those of the so-called chemical-sensitization type comprising a resinous ingredient insolubilized in an alkaline solution by substitution with acid-dissociate groups but solubilized in the presence of an acid by the dissociation of the protective substituent groups and a compound capable of releasing an acid by the irradiation with actinic rays as well as those comprising an alkali-soluble resin, a low molecular-weight compound having an acid-dissociate group and insoluble in an aqueous alkaline solution but capable of being imparted with increased alkali-solubility in the presence of an acid and a compound capable of releasing an acid by the irradiation with actinic rays.

The negative-working photoresist composition includes those of the so-called chemical-sensitization type comprising an alkali-soluble novolac resin or an alkali-insoluble resin having acid-dissociate groups but capable of being imparted with increased alkali-solubility in the presence of an acid, an acid-crosslinking compound and a compound capable of releasing an acid by the irradiation with actinic rays and those of the photopolymerization type comprising an alkali-soluble resin, an ethylenically unsaturated monomeric compound, a photopolymerization initiator and a dye or pigment.

The method of the present invention for the pre-treatment of a photoresist layer can be applied to any photolithographic processes for the manufacture of, for example, semiconductor devices, liquid crystal display panels, color filters and so on without particular limitations.

When a photoresist layer on a substrate surface is subjected to a pre-treatment according to the inventive method for removing extraneous portions of the photoresist layer, the aqueous cleaning solution is brought into contact with the photoresist layer either before or after drying selectively on the areas excepting for the area defined for the photolithographic patterning, such as the marginal zone of the defined area and peripheral and back surfaces of the substrate so that the photoresist layer is dissolved away by the attack of the aqueous cleaning solution. Though dependent on the particular coating method used for coating of the substrate surface with a photoresist composition, such as spin coating method, bar coater method, roll coater method and the like, formation of an extraneous photoresist layer on the substrate surface excepting for the area defined for patterning is more or less unavoidable.

Various techniques are applicable in the inventive method for bringing the aqueous cleaning solution into contact with extraneous portions of the photoresist layer on the substrate surface. For example, a nozzle ejecting the aqueous cleaning solution is moved over the areas, such as the periphery of the substrate, from which the photoresist layer is to be removed. The photoresist layer on the back surface of the substrate can be removed by the so-called back-rinse method in which the substrate is rotated and the cleaning solution is ejected from a nozzle below at the back surface of the rotating substrate. Further, it is preferable that the periphery of the substrate is horizontally inserted into a slit of a reservoir filled with the cleaning solution so that the solution is held in contact with the photoresist layer on the peripheral surface of the substrate for a pre-determined length of time until completion of removal of the photoresist layer by dissolution.

Figure 2:
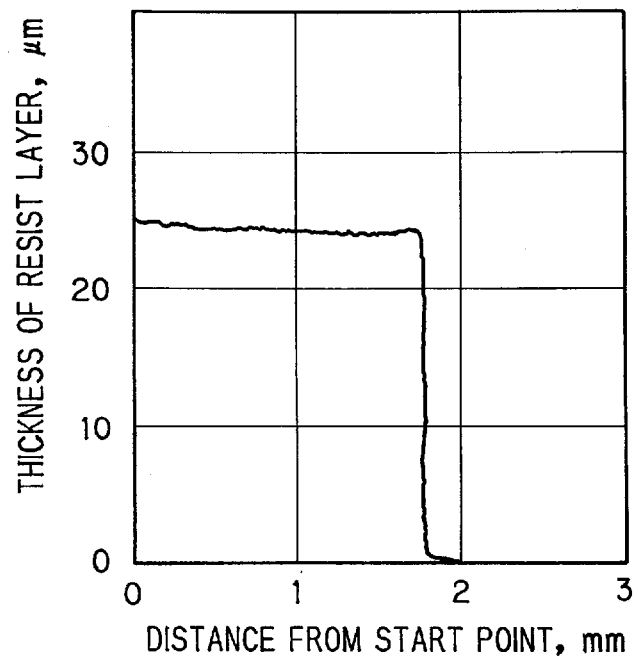

The advantages of the inventive method for the pre-treatment of a photoresist layer are clearly shown by making comparison between a prior art method and the inventive method for the condition of the photoresist layer after removal of the extraneous portions. Namely, the circumference of the photoresist layer left unrevived on the substrate surface by the pre-treatment to dissolve away the extraneous portions of the photoresist layer is more clearly defined in the inventive method than in the conventional method. FIGS. 1 and 2 of the accompanying drawing each show the results of the thickness measurement of the remaining photoresist layer by using a level-difference probe tester in Comparative Example 7 and Example 12, respectively, described later on a photoresist layer having a thickness of 25 $\mu$m. As is shown in FIG. 2, the peripheral surface of the remaining photoresist layer in the inventive method stands upright on the substrate surface while, in contrast thereto, the remaining photoresist layer in the conventional method has an inclined peripheral surface and indicates swelling of the layer at the very edge.

The increase in the thickness of the photoresist layer R in % by the above mentioned phenomenon of swelling can be expressed by the equation: $R, \% = (d'-d)/d \times 100$, in which d is the thickness of the unswollen layer in the bulk area and d' is the largest thickness of the swollen layer along the circumference. The value R in the conventional method is as large as 20% or even larger while the value of R in the inventive method always does not exceed 5% and rarely exceeds 3%.

Since the major constituent in the cleaning solution used in the inventive method is water, the solution has a very high flash point with little danger of fire or explosion and is quite safe to the human health without problems in environmental pollution in addition to the above described advantages relative to definiteness of removal of the extraneous photoresist layer so that the method of the invention is applicable to any photolithographic patterning processes for the manufacture of high-precision devices.

In the following, the method of the present invention is described in more detail by way of Examples and Comparative Examples, in which the term of "parts" for the amounts of the ingredients in the cleaning solutions always refers to "parts by weight". The cleaning solutions used in the Examples and Comparative Examples were evaluated for the following items by the procedures respectively described there.

(1) Surface tension of the solution

Measurements were made at 25° C. By using a Du Nosy tensiometer.

(2) Dissolving power to photoresist layer

A 400 mm by 500 mm wide glass plate was coated with a pigment-containing negative-working photoresist composition of the photopolymerization type (CFPR BK-421S, a product by Tokyo Ohka Kogyo Co.) on a spinner followed by drying for 160 seconds on a hot plate at 90° C. to give a dried resist layer having a thickness of 2.0 $\mu$m as dried.

A test piece taken from the glass plate bearing the resist layer by cutting was immersed for 5 seconds at 23° C. in the cleaning solution contained in a glass beaker and the plate pulled up from the solution was visually examined to record the results in three ratings of A for complete removal of the resist layer, B for incomplete removal of the resist layer leaving some debris of the resist layer and C for substantial failure of removal of the resist layer.

(3) Swelling of resist layer

The photoresist layer formed on a glass plate in the above described testing item (2) was removed completely on a defined area with the cleaning solution using a cleaner apparatus (Model TR-36000, manufactured by Tokyo Ohka Kogyo Co.) and the thickness of the remaining layer along the marginal zone was determined across the periphery of the layer by using a probe level-difference tester (Model DECTAK, manufactured by Nippon Sinku Gijutu Co.) to obtain a graph such as those shown in FIGS. 1 and 2. The results were recorded in two ratings of A for a rate of swelling R of 5% or smaller and B for a rate of swelling R larger than 5%.

(4) Go-around of solution

The glass substrate plate bearing a photoresist layer prepared in the above described testing item (2) was subjected to the cleaning treatment to remove the resist layer on extraneous areas with the cleaning solution filling a cleaner apparatus (Model TR-36000, supra) and the back surface of the substrate plate was visually examined to record the condition of the surface in two ratings of A when go-around of the cleaning solution was not detected and B when go-around of the solution was detected.

EXAMPLE 1

An aqueous cleaning solution was prepared by dissolving 5 parts of tetramethylammonium hydroxide (TMAH) in a mixture of 15 parts of 1,3-dimethyl-2-imidazolidinone (DMI) and 80 parts of water. The solution had a surface tension of 60.0 dyne/cm and the ratings in the other evaluation items were all A.

EXAMPLE 2

An aqueous cleaning solution was prepared by dissolving 3 parts of monoethanolamine (MEA) in a mixture of 10 parts of propyleneglycol monomethylether (PGME) and 87 parts of water. The solution had a surface tension of 50.2 dyne/cm and the ratings in the other evaluation items were all A.

EXAMPLE 3

An aqueous cleaning solution was prepared by dissolving 2.38 parts of TMAH in a mixture of 15 parts of PGME and 82.62 parts of water. The solution had a surface tension of 37.7 dyne/cm and the ratings in the other evaluation items were all A.

EXAMPLE 4

An aqueous cleaning solution was prepared by dissolving 2.38 parts of TMAH and 0.5 part of 2-butyn-1,4-diol in a mixture of 15 parts of PGME and 82.12 parts of water. The solution had a surface tension of 46.4 dyne/cm and the ratings in the other evaluation items were all A.

EXAMPLE 5

An aqueous cleaning solution was prepared by dissolving 5 parts of TMAH and 4.6 parts of (2-hydroxyethyl)pyridine (HP) in a mixture of 9.2 parts of DMI and 81.2 parts of water. The solution had a surface tension of 55.0 dyne/cm and the ratings in the other evaluation items were all A.

EXAMPLE 6

An aqueous cleaning solution was prepared by dissolving 2.38 parts of TMAH in a mixture of 10 parts of ethyleneglycol monomethyl ether and 87.62 parts of water. The solution had a surface tension of 57.8 dyne/cm and the ratings in the other evaluation items were all A.

EXAMPLE 7

An aqueous cleaning solution was prepared by dissolving 5 parts of TMAH in a mixture of 1.5 parts of isopropyl alcohol (IPA) and 93.5 parts of water. The solution had a surface tension of 54.4 dyne/cm and the ratings in the other evaluation items were all A.

EXAMPLE 8

An aqueous cleaning solution was prepared by dissolving 1 part of TMAH and 4.6 parts of HP in a mixture of 9.2 parts of DMI and 85.2 parts of water. The solution had a surface tension of 57.0 dyne/cm and the ratings in the other evaluation items were all A.

EXAMPLE 9

An aqueous cleaning solution was prepared by dissolving 3 parts of 2-(2-aminoethoxy)ethanol (AEE) in a mixture of 10 parts of PGME and 87 parts of water. The solution had a surface tension of 53.0 dyne/cm and the ratings in the other evaluation items were all A.

EXAMPLE 10

An aqueous cleaning solution was prepared by dissolving 3 parts of MEA and 0.5 part of pyrocatechol in a mixture of 10 parts of PGME and 86.5 parts of water. The solution had a surface tension of 51.0 dyne/cm and the ratings in the other evaluation items were all A.

EXAMPLE 11

An aqueous cleaning solution was prepared by dissolving 0.5 part of TMAH in a mixture of 10 parts of methyl alcohol and 89.5 parts of water. The solution had a surface tension of 55.0 dyne/cm and the ratings in the other evaluation items were all A.

EXAMPLE 12

An aqueous cleaning solution was prepared by dissolving 3 parts of TMAH in a mixture of 8 parts of dipropyleneglycol monomethyl ether and 89 parts of water. The solution had a surface tension of 58.6 dyne/cm and the ratings in the other evaluation items were all A.

Comparative Example 1

An aqueous cleaning solution was prepared by dissolving 5 parts of TMAH and 12.5 parts of N-methyl-2-pyrrolidone in 82.5 parts of water. The solution had a surface tension of 59.7 dyne/cm and the ratings in the other evaluation items were B, A and A for the items (2), (3) and (4), respectively.

Comparative Example 2

An aqueous cleaning solution was prepared by dissolving 2.3 parts of TMAH and 3.7 parts of diethanolamine in 94 parts of water. The solution had a surface tension of 68.8 dyne/cm and the ratings in the other evaluation items were B, A and A for the items (2), (3) and (4), respectively.

Comparative Example 3

An aqueous cleaning solution was prepared by dissolving 5 parts of TMAH and 15 parts of AEE in 80 parts of water. The solution had a surface tension of 64.6 dyne/cm and the ratings in the other evaluation items were B, A and A for the items (2), (3) and (4), respectively.

Comparative Example 4

An aqueous cleaning solution was prepared by dissolving 5 parts of TMAH and 15 parts of imidazole in 80 parts of water. The solution had a surface tension of 70.7 dyne/cm and the ratings in the other evaluation items were B, A and A for the items (2), (3) and (4), respectively.

Comparative Example 5

An aqueous cleaning solution was prepared by dissolving 15 parts of sodium carbonate in 85 parts of water. The solution had a surface tension of 52.0 dyne/cm and the ratings in the other evaluation items were B, A and A for the items (2), (3) and (4), respectively.

Comparative Example 6

An aqueous cleaning solution was prepared by dissolving 1 part of TMAH in a mixture of 30 parts of IPA and 69 parts of water. The solution had a surface tension of 26.7 dyne/cm and the ratings in the other evaluation items were A for each of the items (2) and (3) and (B) for the item (4).

Comparative Example 7

The cleaning solution used here was cyclohexanone as such which had a surface tension of 35.1 dyne/cm. The results in the evaluation items were that the rating for the item (2) was A but the rating for item (3) was B.

Comparative Example 8

The cleaning solution used here was methyl ethyl ketone as such which had a surface tension of 24.6 dyne/cm. The results of the evaluation items were that the ratings for the items (2) and (3) were C and B, respectively.

What is claimed is:

1. A method for the pre-treatment of a photoresist layer formed on the surface of a substrate from an alkali-soluble photoresist composition which comprises the step of:

bringing, prior to a pattern-wise exposure of the photoresist layer to actinic rays in an area defined for patterning, the photoresist layer on the substrate surface in areas excepting for the area defined for the pattern-wise exposure to actinic rays into contact with an aqueous cleaning solution, which consists essentially of (a) a mixture of water and a water-miscible organic solvent as an aqueous medium and (b) a water-soluble alkaline compound dissolved in the aqueous medium, to effect dissolution of the photoresist layer, wherein the amount of the water-miscible organic solvent in the cleaning solution is in the range from 0.05 to 20% by weight, the amount of the water-soluble alkaline compound in the cleaning solution is in the range from 0.05 to 20% by weight, the water-miscible organic solvent in the cleaning solution is selected from the group consisting of monohydric alcohols, alkyl ethers of an alkyleneglycol and aprotic solvents, and said aqueous solution has a surface tension in the range of from 40 to 70 dyne/cm at 25° C.

2. The method for the pre-treatment of a photoresist layer formed on the surface of a substrate as claimed in claim 1 in which the water-miscible organic solvent in the cleaning solution is a monohydric alcohol selected from the group consisting of methyl alcohol and isopropyl alcohol.

3. The method for the pre-treatment of a photoresist layer formed on the surface of a substrate as claimed in claim 1 in which the water-miscible organic solvent in the cleaning solution is an alkyl ether of an alkyleneglycol selected from the group consisting of monoalkyl ethers of ethyleneglycol, propyleneglycol or dipropyleneglycol, of which the alkyl group has 1 to 4 carbon atoms.

4. The method for the pre-treatment of a photoresist layer formed on the surface of a substrate as claimed in claim 3 in which the water-miscible organic solvent in the cleaning solution is a methyl ether of an alkyleneglycol selected from the group consisting of methyl ethers of ethyleneglycol or propyleneglycol.

5. The method for the pre-treatment of a photoresist layer formed on the surface of a substrate as claimed in claim 3 in which the water-miscible organic solvent in the cleaning solution is dipropyleneglycol monomethyl ether.

6. The method for the pre-treatment of a photoresist layer formed on the surface of a substrate as claimed in claim 1 in which the water-miscible organic solvent in the cleaning solution is an aprotic solvent which is 1,3-dimethyl-2-imidazolidinone.

7. The method for the pre-treatment of a photoresist layer formed on the surface of a substrate as claimed in claim 1 in which the water-soluble alkaline compound is selected from the group consisting of inorganic alkaline compounds, alkanolamine compounds, nitrogen-containing heterocyclic compounds and quaternary ammonium hydroxides.

8. The method for the pre-treatment of a photoresist layer formed on the surface of a substrate as claimed in claim 7 in which the water-soluble alkaline compound is selected from the group consisting of sodium carbonate, monoethanolamine, diethanolamine, 2-(2-aminoethoxy) ethanol, 2-hydroxyethyl pyridine, N-methyl-2-pyrrolidone, imidazol and tetramethylammonium hydroxide.

9. The method according to claim 1, wherein said method is performed by horizontally inserting the periphery of the substrate bearing the photoresist layer into a slit of a reservoir filled with the cleaning solution.

10. A method for the pre-treatment of a photoresist layer formed on the surface of a substrate from an alkali-soluble photoresist composition which comprises the step of:

bringing, prior to a pattern-wise exposure of the photoresist layer to actinic rays in an area defined for patterning, the photoresist layer on the substrate surface in areas excepting for the area defined for the pattern-wise exposure to actinic rays into contact with an aqueous cleaning solution, which consists essentially of (a) a mixture of water and a water-miscible organic solvent as an aqueous medium, (b) a water-soluble alkaline compound dissolved in the aqueous medium and (c) an anti-corrosion agent, wherein the amount of the anti-corrosion agent in the cleaning solution is in the range from 0.01 to 10% by weight, the amount of the water-miscible organic solvent in the cleaning solution is in the range from 0.05 to 20% by weight, the amount of the water-soluble alkaline compound in the cleaning solution is in the range from 0.05 to 20% by weight, the water-miscible organic solvent in the cleaning solution is selected from the group consisting of monohydric alcohols, alkyl ethers of an alkyleneglycol and aprotic solvents, and said aqueous solution has a surface tension in the range from 40 to 70 dyne/cm at 25° C.

11. The method for the pre-treatment of a photoresist layer formed on the surface of a substrate as claimed in claim 10 in which the anti-corrosion agent is selected from the group consisting of aromatic hydroxyl compounds, alkynol compounds and triazole compounds.

12. The method for the pre-treatment of a photoresist layer formed on the surface of a substrate as claimed in claim 11 in which the anti-corrosion agent is selected from the group consisting of 2-butyn-1,4-diol and catechol.

13. The method for the pre-treatment of a photoresist layer formed on the surface of a substrate as claimed in claim 10 in which the water-miscible organic solvent in the cleaning solution is a monohydric alcohol selected from the group consisting of methyl alcohol and isopropyl alcohol.

14. The method for the pre-treatment of a photoresist layer formed on the surface of a substrate as claimed in claim 10 in which the water-miscible organic solvent in the cleaning solution is an alkyl ether of an alkyleneglycol selected from the group consisting of monoalkyl ethers of ethyleneglycol, propyleneglycol or dipropyleneglycol, of which the alkyl group has 1 to 4 carbon atoms.

15. The method for the pre-treatment of a photoresist layer formed on the surface of a substrate as claimed in claim 14 in which the water-miscible organic solvent in the cleaning solution is a methyl ether of an alkyleneglycol selected from the group consisting of methyl ethers of ethyleneglycol or propyleneglycol.

16. The method for the pre-treatment of a photoresist layer formed on the surface of a substrate as claimed in claim 14 in which the water-miscible organic solvent in the cleaning solution is dipropyleneglycol monomethyl ether.

17. The method for the pre-treatment of a photoresist layer formed on the surface of a substrate as claimed in claim 10 in which the water-miscible organic solvent in the cleaning solution is an aprotic solvent which is 1,3-dimethyl-2imidazolidinone.

18. The method for the pre-treatment of a photoresist layer formed on the surface of a substrate as claimed in claim 10 in which the water-soluble alkaline compound is selected from the group consisting of inorganic alkaline compounds, alkanolamine compounds, nitrogen-containing heterocyclic compounds and quaternary ammonium hydroxides.

19. The method for the pre-treatment of a photoresist layer formed on the surface of a substrate as claimed in claim 18 in which the water-soluble alkaline compound is selected from the group consisting of sodium carbonate, monoethanolamine, diethanolamine, 2-(2-aminoethoxy) ethanol, 2-hydroxyethyl pyridine, N-methyl-2-pyrrolidone, imidazol and tetramethylammonium hydroxide.

20. The method according to claim 10, wherein said method is performed by horizontally inserting the periphery of the substrate bearing the photoresist layer into a slit of a reservoir filled with the cleaning solution.

* * * * *